United States Patent
Wu

(10) Patent No.: US 8,304,798 B2
(45) Date of Patent: Nov. 6, 2012

(54) LIGHT-EMITTING DIODE MODULE AND MANUFACTURING METHOD THEREOF

(75) Inventor: Chia-Min Wu, Taoyuan County (TW)

(73) Assignee: Light Ocean Technology Corp., Taoyuan County (TW)

( * ) Notice: Subject to any disclaimer, the term of this patent is extended or adjusted under 35 U.S.C. 154(b) by 98 days.

(21) Appl. No.: 12/875,308

(22) Filed: Sep. 3, 2010

(65) Prior Publication Data

US 2011/0121339 A1    May 26, 2011

(30) Foreign Application Priority Data

Nov. 25, 2009   (CN) .......................... 2009 1 0224245

(51) Int. Cl.
*H01L 33/60* (2010.01)
*H01L 33/00* (2010.01)

(52) U.S. Cl. .................. 257/98; 257/99; 257/E33.072; 257/E33.001

(58) Field of Classification Search ............ 257/98–100, 257/E33.072, E33.001
See application file for complete search history.

(56) References Cited

U.S. PATENT DOCUMENTS

| | | | |
|---|---|---|---|
| 2006/0124953 A1* | 6/2006 | Negley et al. ................... | 257/99 |
| 2008/0315239 A1* | 12/2008 | Lin et al. .......................... | 257/99 |
| 2011/0114970 A1* | 5/2011 | Teng et al. ....................... | 257/88 |

* cited by examiner

*Primary Examiner* — Benjamin Sandvik
*Assistant Examiner* — Whitney T Moore
(74) *Attorney, Agent, or Firm* — Rosenberg, Klein & Lee

(57) ABSTRACT

A light-emitting diode (LED) module includes a substrate, an LED, a first encapsulation element and a second light-pervious encapsulation element. The substrate has a first surface, a second surface, a circuit layer and an opening, wherein the opening penetrates through the first surface and the second surface, and the circuit layer includes at least one first conductive contact disposed on the first surface. The LED is disposed in the opening and is electrically connected to the first conductive contact. The first encapsulation element and the second light-pervious encapsulation element are respectively disposed on the first surface and the second surface, for encapsulating the LED and the first conductive contact. The aforementioned LED module may output light from the back of the LED, thereby improving the light output efficiency of the LED module. A manufacturing method of the aforementioned LED module is also herein disclosed.

8 Claims, 6 Drawing Sheets

LIGHT-EMITTING DIODE MODULE AND MANUFACTURING METHOD THEREOF

BACKGROUND OF THE INVENTION

1. Field of the Invention

The present invention is related to a light-emitting diode module and the manufacturing method thereof, and more particularly to a light-emitting diode module and the manufacturing method thereof improving the light output efficiency.

2. Description of the Prior Art

Light-emitting diodes (LEDs) have advantages of small size, long lifespan and power saving. Therefore, LEDs have been widely applied for the purposes of backlight module, illuminating lamp, traffic light and decoration, etc.

A prior art LED module is configured to have the back of an LED set on a substrate or a heat dissipation element, and the active side of the LED electrically connected with a circuit layer of the substrate. The light emitted from recombination of electrons and holes at the PN junction radiates outwardly toward the active side and back of the LED. However, according to the aforementioned structure, the light emitted toward the back of the LED would be blocked by the substrate or the heat dissipation element and may not be used efficiently, causing the LED module to have worse light output efficiency.

In summary, it is a present goal to improve the light output efficiency of the LED module.

SUMMARY OF THE INVENTION

With respect to the aforementioned problem, an object of the present invention is to provide a light-emitting diode (LED) module and a manufacturing method thereof, wherein a light-pervious encapsulation element is used to carry an LED; therefore, the LED module of the present invention can output light from the back of the LED, improving the light output efficiency of the LED module.

According to an embodiment, the LED module includes a substrate, an LED, a first encapsulation element and a second encapsulation element. The substrate has a first surface, a second surface, a circuit layer and an opening, wherein the opening penetrates through the first surface and the second surface, and the circuit layer includes at least one first conductive contact disposed on the first surface. The LED is disposed in the opening, and is electrically connected to the first conductive contact. The first encapsulation element is disposed on the first surface of the substrate, for encapsulating the LED and the first conductive contact. The second light-pervious encapsulation element is disposed on the second surface of the substrate for encapsulating the LED and being a primary light output side of the light-emitting element module.

According to another embodiment, the manufacturing method of the LED module includes: providing a carrier and a substrate, wherein the substrate has a first surface, a second surface, a circuit layer and an opening, and the substrate is arranged to have the second surface set on the carrier, wherein the opening penetrates through the first surface and the second surface, exposing a surface of the carrier, and the circuit layer includes at least one first conductive contact disposed on the first surface; arranging an LED on the surface of the carrier corresponding to the opening; electrically connecting the LED and the first conductive contact; arranging a first encapsulation element on the side of the first surface of the substrate, for encapsulating the LED and the first conductive contact; removing the carrier, and arranging a second light-pervious encapsulation element on the side of the second surface of the substrate, for encapsulating the LED.

The objective, technologies, features and advantages of the present invention will become more apparent from the following description in conjunction with the accompanying drawings, wherein certain embodiments of the present invention are set forth by way of illustration and examples.

DESCRIPTION OF THE PREFERRED EMBODIMENT

Figure 1:
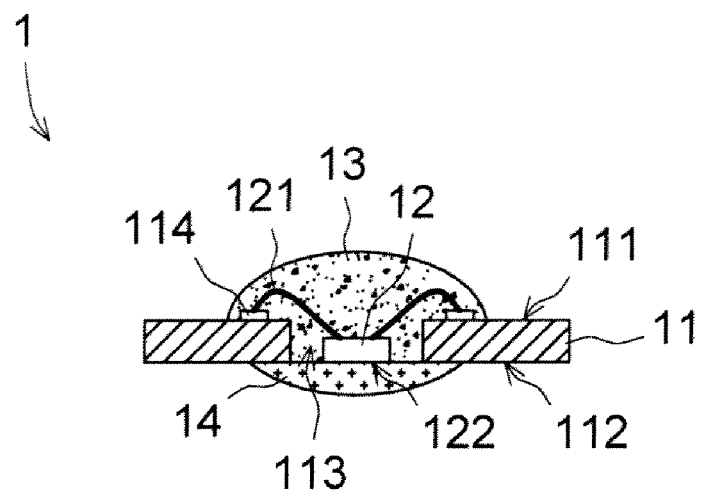
FIG. 1 is a cross-sectional diagram schematically illustrating the LED module according to a first embodiment of the present invention.

Referring to FIG. 1, a light-emitting diode (LED) module 1 according to an embodiment includes a substrate 11, an LED 12, a first encapsulation element 13 and a second light-pervious encapsulation element 14. The substrate 11 has a first surface 111, a second surface 112, and an opening 113, wherein the opening penetrates through the first surface 111 and the second surface 112. Besides, the substrate 11 has at least one circuit layer. For example, the circuit layer includes at least one first conductive contact 114 disposed on the first surface 111. In one embodiment, the substrate 11 may be a copper foil substrate, an insulating substrate, a glass fiber substrate, a ceramic substrate, a composite substrate, a flexible substrate, a glass fiber prepreg, or a polymeric substrate. The number of layers of the substrate is not limited, and the substrate may include a plurality of substrates stacked.

The LED 12 is disposed in the opening 113 of the substrate 11, and is electrically connected to the first conductive contact 114 of the circuit layer. For example, the LED 12 may use a lead wire 121 to electrically connect to the first conductive contact 114 on the substrate 11. It is noted that each substrate 11 is not limited to include one opening 113, and each opening 113 is not limited to accommodate one LED. A single substrate 11 may also include a plurality of openings 113, and a plurality of LEDs 12 may be disposed in a single opening 113. The first encapsulation element 13 is disposed on the first surface 111 of the substrate 11, for encapsulating the LED 12 and the first conductive contact 114. The second light-pervious encapsulation element 14 is disposed on the second surface 112 of the substrate 11, for encapsulating the LED 12. In one embodiment, the first encapsulation element 13 may include a polymeric material. Preferably, the first encapsulation element 13 may also include a light-pervious material.

Figure 2:
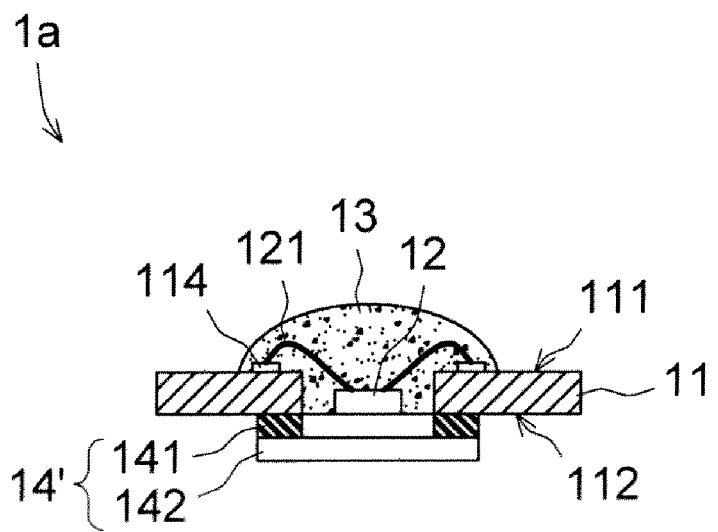
FIG. 2 is a cross-sectional diagram schematically illustrating the LED module according to a second embodiment of the present invention.

In one embodiment, the second light-pervious encapsulation element 14 may include a polymeric material. In addition, according to another embodiment in reference to FIG. 2, the second light-pervious encapsulation element 14' of the LED module 1a may include a spacer 141 and a light-pervious substrate 142, wherein the spacer 141 is disposed on the second surface 112 of the substrate 11, and the light-pervious substrate 142 is disposed on the spacer 141, forming a gap between the light-pervious substrate 142 and the LED 12.

In one embodiment, the LED module further includes a fluorescent material which may be disposed on the surfaces of the LED 12. For example, a fluorescent film may be disposed on the LED 12, or the fluorescent material may be mixed in the polymeric material of the second light-pervious encapsulation element and/or the first encapsulation element. Moreover, the fluorescent material may also be disposed on the surface (e.g. internal surface or external surface) of the light-pervious substrate 142 through a coating or adhesion method, or mixed in the light-pervious substrate 142. The separation provided by the gap between the light-pervious substrate 142 and the LED 12 helps prevent the fluorescent material from deteriorating due to the heat generated by the LED 12.

Figure 3A:
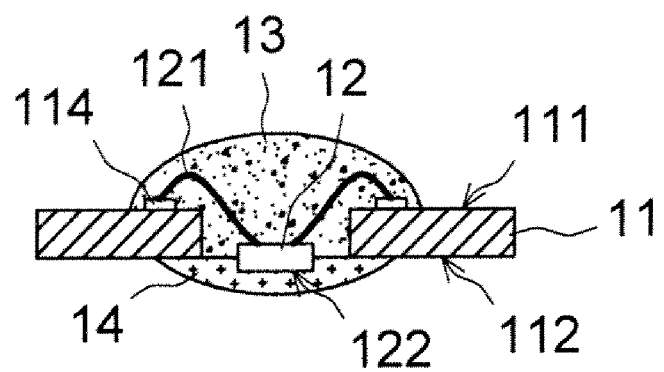
FIG. 3a and FIG. 3b are cross-sectional diagrams respectively illustrating the LED modules of a third and a fourth embodiments of the present invention.
Figure 3B:
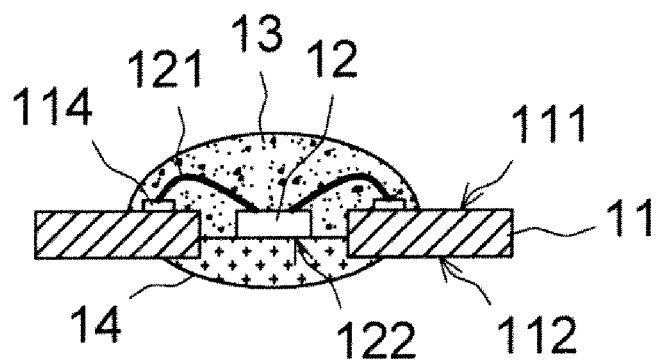

In the embodiment illustrated in FIG. 1, the bottom surface 122 of the LED 12 is coplanar with the second surface 112 of the substrate 11, but the present invention is not limited to be implemented as such. The bottom surface 122 of the LED 12 may also be higher (as illustrated in FIG. 3a) or lower (as illustrated in FIG. 3b) than the second surface 112 of the substrate 11. That is, as long as the LED 12 is disposed within the projection region of the opening 113 of the substrate 11, the variation should be considered falling within the spirit of the present invention.

Figure 4:
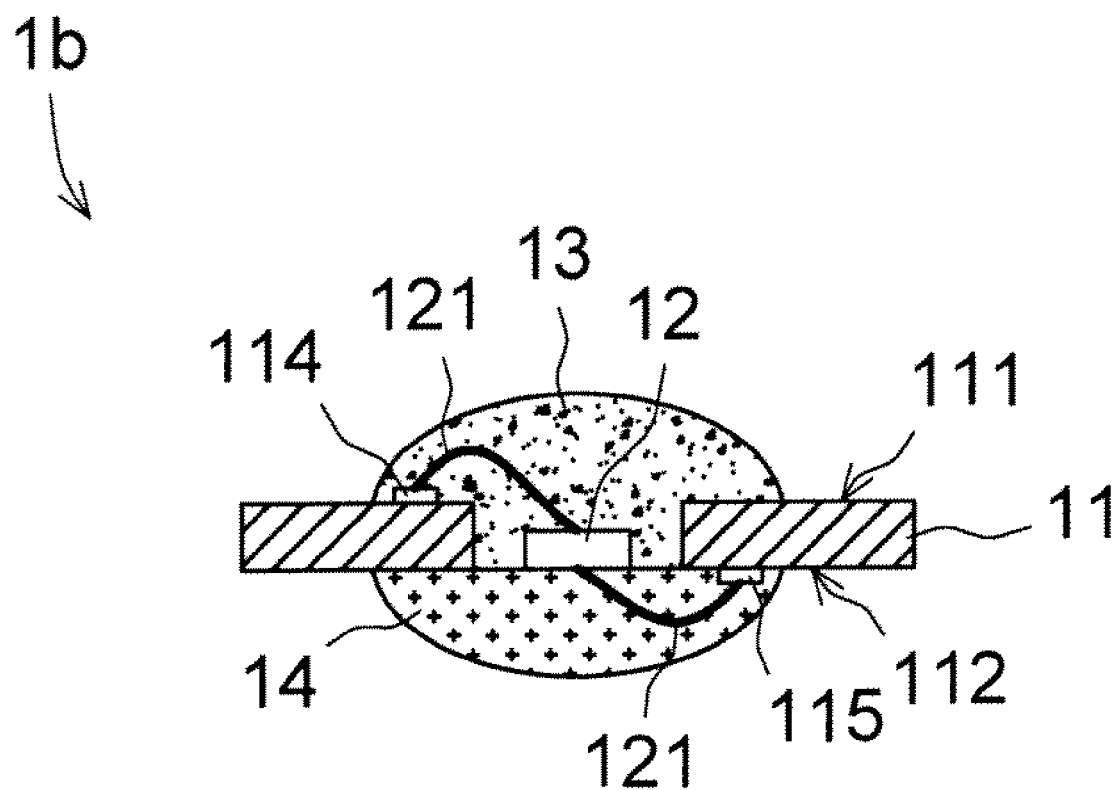
FIG. 4 is a cross-sectional diagram schematically illustrating the LED module of a fifth embodiment of the present invention.

Referring to FIG. 4, the LED module 1b of the present embodiment is compared to that of the embodiment illustrated in FIG. 1. The difference between the two lies in that the circuit layer of the LED module 1b includes at least one second conductive contact 115 disposed on the second surface 112 of the substrate 11. As such, the N electrode and the P electrode of the LED 12 may be respectively electrically connected to the first conductive contact 114 on the first surface 111 and the second conductive contact 115 of the second surface 112.

Figure 5A:
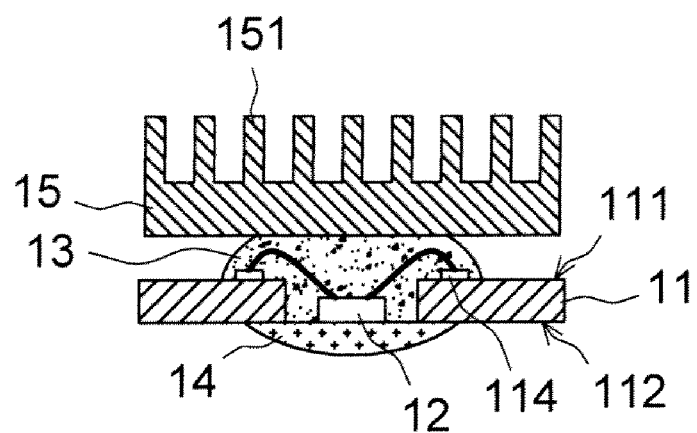
FIG. 5a and FIG. 5b are cross-sectional diagrams respectively illustrating the LED modules according to a sixth and a seventh embodiments of the present invention.
Figure 5B:
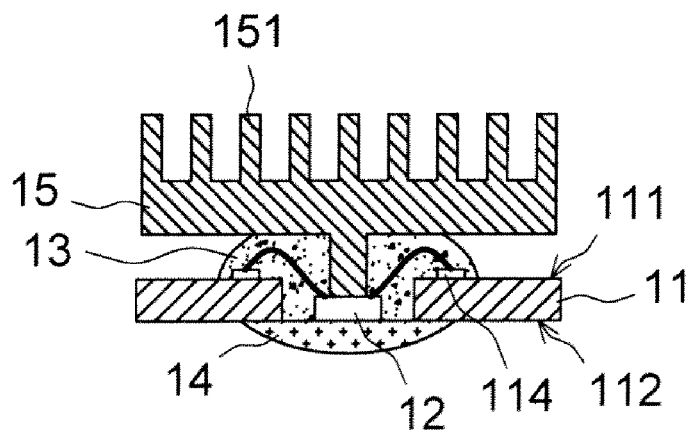

In one embodiment, the LED module further includes a reflection element (not shown). The reflection element may be disposed on the surface of the first encapsulation element 13, for the light emitted toward the side of the first surface 111 to be reflected toward the direction of the second light-pervious encapsulation element 14. Referring to FIG. 5a and FIG. 5b, the LED module according to the present embodiment further includes a heat dissipation element 15 disposed on the side of the first surface 111 of the substrate 11, for improving the heat dissipation problem of the LED module. The heat dissipation element 15 may be in contact with the first encapsulation element 13, as shown in FIG. 5a, or may be directly in contact with the LED 12, as shown in FIG. 5b. It is noted that the shape of the heat dissipation element may be designed according to requirements. For example, heat dissipation fins 151 may be disposed on the surface of the heat dissipation element 15 for further enhancing the heat dissipation effect.

According to the foregoing structures, the LED modules use the second light-pervious encapsulation element 14 as the primary light output side. In one embodiment, the LED may be arranged to have its P electrode facing toward the direction of the second light-pervious encapsulation element 14. Since the P electrode has a better light transmittance, using the P electrode of the LED as the primary light output side may improve the light output efficiency of the LED module. However, the present invention is not limited to be implemented as such. The N electrode of the LED may also be used as the light output side for an alternative embodiment.

Figure 6A:
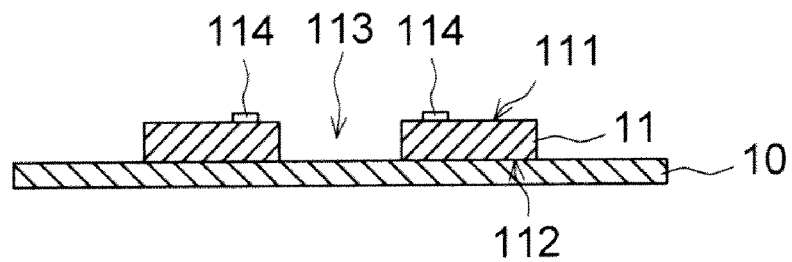
FIG. 6a to FIG. 6e are cross-sectional diagrams schematically illustrating the manufacturing method of the LED module according to an embodiment of the present invention.

Referring to FIG. 6a to FIG. 6e and FIG. 1, there are illustrated the manufacturing method of the LED module according to an embodiment. Referring to FIG. 6a, first, a carrier 10 and a substrate 11 are provided, wherein the substrate 11 has a first surface 111, a second surface 112 and an opening 113, and the substrate 11 is arranged to have its second surface 112 set on the carrier 10. The opening 13 penetrates through the first surface 111 and the second surface 112, exposing a surface of the carrier 10. Besides, the substrate 11 has at least one circuit layer. The circuit layer includes at least one conductive contact 114 disposed on the first surface 111.

Figure 6B:
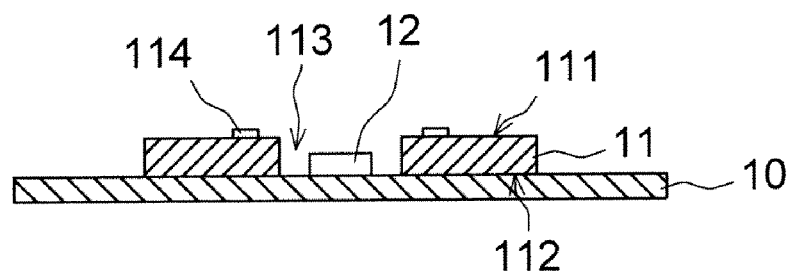
Figure 6C:
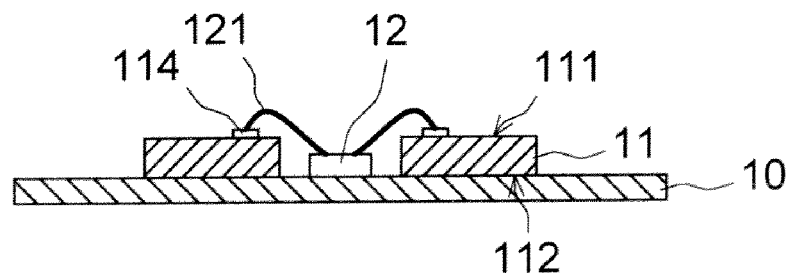
Figure 6D:
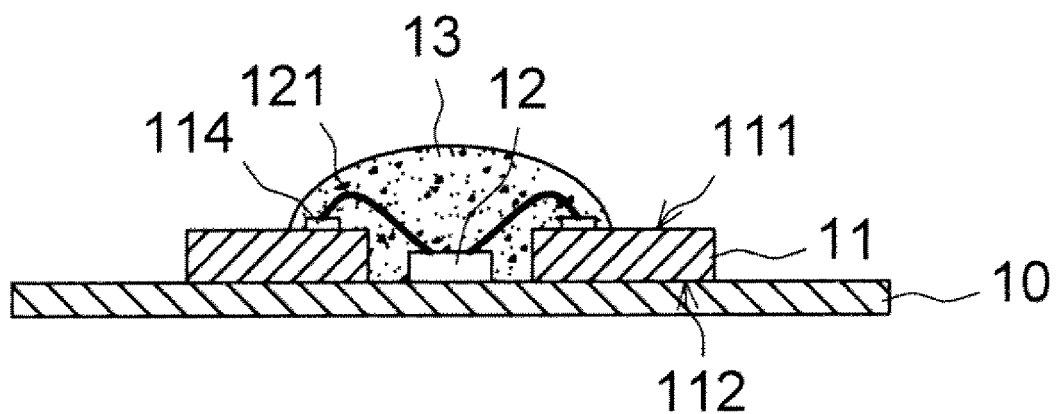
Figure 6E:
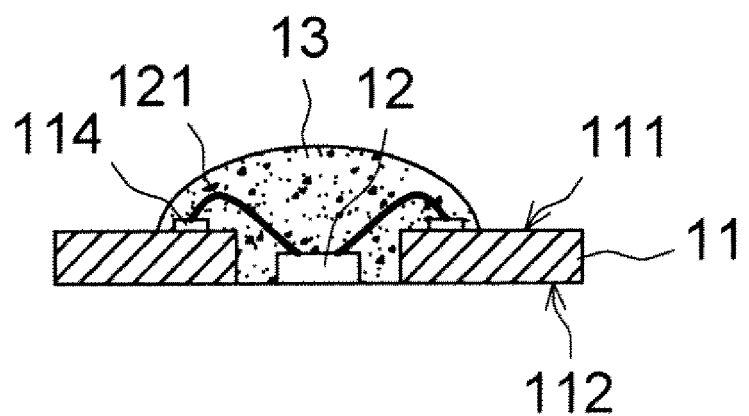

Referring to FIG. 6b, an LED 12 is disposed on the surface of the carrier 10 corresponding to the opening 113, i.e. the projection region of the opening 113 relative to the carrier 10. Referring to FIG. 6c, the LED 12 is electrically connected to the circuit layer on the substrate 11, such as to the first conductive contact 114. Referring to FIG. 6d, a first encapsulation element 13 is disposed on the side of the first surface 111 of the substrate 11 for encapsulating the LED 12 and the first conductive contact 114. As illustrated in FIG. 6e, the carrier 10 is removed. Finally, a second light-pervious encapsulation element 14 is disposed on the side of the second surface 112 of the substrate 11 for encapsulating the LED 12, and then an LED module 1 as shown in FIG. 1 is accomplished.

It is noted that the surface of the carrier 10 corresponding to the opening 113 may be higher or lower than the second surface 112 of the substrate 11, or may be coplanar with the second surface 112 of the substrate 11. As such, the relative position of the LED 12 to the substrate 11 may be modified according to requirements.

In one embodiment, the circuit layer on the substrate 11 further includes at least one second conductive contact 115 (as shown in FIG. 4) disposed on the second surface 112 of the substrate 11. In this embodiment, the LED 12 is first electrically connected to the second conductive contact 115 on the second surface 112, and then the second light-pervious encapsulation element 14 is set, so as to accomplish the LED module as illustrated in FIG. 4. In addition, persons skilled in the art may apply the aforementioned fluorescent material, reflection element, heat dissipation element and so on to the manufacturing process of the LED module of the present invention. The details are thus omitted.

In conclusion, the LED module and the manufacturing method of the present invention use the light-pervious encapsulation element to carry the LED. Therefore, the LED module may output light from the back of the LED without having to arrange a conductive bump, thereby improving the light output efficiency of the LED module. Preferably, the P electrode of the LED may be arranged to face toward the light-pervious encapsulation element, for further improving the light output efficiency of the LED module.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A light-emitting element module comprising:
    a substrate having a first surface, a second surface, a circuit layer and an opening, wherein the opening penetrates through the first surface and the second surface, and the circuit layer comprises at least one first conductive contact disposed on the first surface;
a light-emitting diode (LED) disposed in the opening, and electrically connected to the first conductive contact;
a first encapsulation element disposed on the first surface of the substrate for encapsulating the LED and the first conductive contact; and
a second light-pervious encapsulation element disposed on the second surface of the substrate, for encapsulating the LED and being a primary light output side of the light-emitting element module.

2. The LED module according to claim 1, wherein the LED comprises a P electrode and an N electrode, and the LED is configured to have the P electrode or the N electrode facing toward the direction of the second light-pervious encapsulation element.

3. The LED module according to claim 1, wherein the bottom surface of the LED is higher or lower than the second surface, or is coplanar with the second surface.

4. The LED module according to claim 1, wherein the circuit layer further comprises at least one second conductive contact disposed on the second surface, and the LED respectively electrically connects to the first conductive contact and the second conductive contact.

5. The LED module according to claim 1, wherein the substrate comprises a copper foil substrate, an insulating substrate, a glass fiber substrate, a ceramic substrate, a composite substrate, a flexible substrate, a glass fiber prepreg or a polymeric substrate.

6. The LED module according to claim 1, wherein the first encapsulation element comprises a polymeric material and/or a light-pervious material.

7. The LED module according to claim 1, wherein the second light-pervious encapsulation element comprises a polymeric material, or comprises a spacer and a light-pervious substrate, wherein the spacer is disposed on the second surface of the substrate, the light-pervious substrate is disposed on the spacer, and there exists a gap between the light-pervious substrate and the LED.

8. The LED module according to claim 1, further comprising:
a heat dissipation element disposed on the side of the first surface of the substrate, and contacting the LED and/or the first encapsulation element.

* * * * *